United States Patent
Shirley

(10) Patent No.: US 6,548,111 B1
(45) Date of Patent: Apr. 15, 2003

(54) METHOD FOR CONTROLLING A TEMPERATURE OF A MICROELECTRONIC SUBSTRATE

(75) Inventor: Paul D. Shirley, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 64 days.

(21) Appl. No.: 09/721,539

(22) Filed: Nov. 21, 2000

Related U.S. Application Data

(62) Division of application No. 09/328,042, filed on Jun. 8, 1999, now Pat. No. 6,322,626.

(51) Int. Cl.⁷ ................................................ B05D 3/12
(52) U.S. Cl. ................. 427/240; 427/372.2; 427/398.1; 427/425; 118/52; 118/320; 438/758
(58) Field of Search ................... 427/240, 425, 427/372.2, 398.1; 118/52, 320; 438/758

(56) References Cited

U.S. PATENT DOCUMENTS

| | | | |
|---|---|---|---|
| 3,710,251 A | 1/1973 | Hagge et al. | 324/158 F |
| 4,432,635 A | 2/1984 | Mayer | 355/30 |
| 4,544,446 A | 10/1985 | Cady | 156/639 |
| 4,899,686 A | 2/1990 | Toshima et al. | 118/50 |
| 5,034,688 A | 7/1991 | Moulene et al. | 324/158 F |
| 5,474,877 A | 12/1995 | Suzuki | 430/325 |
| 5,567,267 A | 10/1996 | Kazama et al. | 156/345 |
| 5,578,127 A | 11/1996 | Kimura | 118/695 |
| 5,578,532 A | 11/1996 | van de Ven et al. | 437/245 |
| 5,580,607 A | 12/1996 | Takekuma et al. | 427/240 |
| 5,762,709 A * | 6/1998 | Sugimoto et al. | 118/52 |
| 5,932,009 A * | 8/1999 | Kim et al. | 118/500 |
| 6,042,712 A * | 3/2000 | Mathieu | 118/59 |
| 6,073,681 A | 6/2000 | Getchel et al. | 165/80.1 |
| 6,107,608 A * | 8/2000 | Hayes | 118/724 |
| 6,168,660 B1 | 1/2001 | Hayes et al. | 118/52 |

FOREIGN PATENT DOCUMENTS

| | | | |
|---|---|---|---|
| JP | 62-205626 A | * | 9/1987 |
| JP | 363140549 A | | 6/1988 |
| JP | 3-230518 A | * | 10/1991 |
| JP | 404099018 A | | 3/1992 |

* cited by examiner

*Primary Examiner*—Shrive P. Beck
*Assistant Examiner*—Kirsten Crockford Jolley
(74) *Attorney, Agent, or Firm*—Dorsey & Whitney LLP

(57) ABSTRACT

A method and apparatus for controlling a temperature of a microelectronic substrate. In one embodiment, the apparatus can include a substrate support configured to engage and support the microelectronic substrate. The apparatus can further include a temperature controller having one or more thermal links coupled directly with the substrate when the substrate is supported by the substrate support. The thermal links can maintain thermal contact with the substrate when the substrate is either stationary or mobile relative to the temperature controller. The temperature controller can heat or cool different portions of the substrate at different rates with one or more of several heat transfer devices, including liquid jets, gas jets, resistive electrical elements and/or thermoelectric elements.

17 Claims, 3 Drawing Sheets

METHOD FOR CONTROLLING A TEMPERATURE OF A MICROELECTRONIC SUBSTRATE

CROSS-REFERENCE TO RELATED APPLICATION

This application is a divisional of U.S. patent application Ser. No. 09/328,042, filed Jun. 8, 1999 now U.S. Pat. No. 6,322,626.

TECHNICAL FIELD

The present invention relates to an apparatus and method for controlling the temperature of a microelectronic substrate during manufacture.

BACKGROUND OF THE INVENTION

Conventional microelectronic devices can include a substrate having a front side on which semiconductor elements and other features are formed and a back side opposite the front side. One conventional technique for forming semiconductor elements and other features on the substrate is to etch selected portions of the front side of the substrate and apply a succession of conductor, semiconductor and/or insulator layers to the substrate which together form the elements. In a typical operation, a layer of photosensitive etch-resistant material (resist) is applied to the center of the substrate and the substrate is spun to distribute the resist over the substrate by centrifugal force. Selected portions of the resist are then exposed to a selected radiation while a mask covers the unselected portions. The radiation causes the selected portions to become soluble (in the case of a positive resist process) or insoluble (in the case of a negative resist process) when exposed to a selected solvent. The solvent washes away the soluble portion of the resist, leaving the remaining portion of the resist to cover selected portions of the substrate. The exposed portions of the substrate are then etched away and the remaining resist is removed to leave one portion of the substrate recessed relative to the surrounding portions. The recessed area can be filled (or the adjacent elevated area can be built up) with the succession of conductor, semiconductor and/or insulator layers to form the semiconductor elements.

During the process discussed above, the resist is exposed to a critical dose of radiation that causes the selected or exposed portion of the resist to become either soluble or insoluble. Typically, the entire resist layer is exposed to the same critical dose of radiation. However, if the thickness of the resist layer is not uniform, the critical dose of radiation may not provide the appropriate exposure level. For example, if the resist layer is locally thick, it may be underexposed, and may not completely change its solubility. If the resist layer is locally thin, it may be overexposed and reflections from the overexposed regions may strike adjacent regions, potentially altering the geometry of the features formed on the substrate, or causing the features to overlap. Accordingly, it is important to maintain the resist layer at a uniform thickness so that a single critical dose of radiation will have the same effect on the entire resist layer.

One factor that controls the thickness of the resist layer is the temperature of the semiconductor substrate on which the resist layer is disposed. For example, where the temperature of the substrate is elevated, solvents in the resist will evaporate more rapidly, thickening the resist before it spins off the edge of the substrate, and causing a local increase in resist thickness. Conversely, where the temperature of the substrate is depressed, solvents in the resist are less likely to evaporate before the resist spins off the substrate, resulting in a local reduction in resist thickness.

To make semiconductor devices more compact, the size of the semiconductor elements on the devices are made as small as possible and are positioned as closely together as possible. Accordingly, it becomes increasingly important to control the thickness of the resist layer to ensure that the selected portions of the resist layer are exposed to the proper radiation dosage so that adjacent features are well defined and do not overlap.

One approach to controlling the distribution of the resist has been to cool the outer edge of the substrate by directing flow of rinsing solution toward the outer periphery of the back side of the substrate. The rinsing solution can cool the wafer as the rinsing solution evaporates, and can prevent the resist from flowing from the front side of the substrate around the outer edge of the substrate to the back side of the substrate. A drawback with this method is that it may not adequately control the temperature of the entire substrate, and may therefore fail to produce a uniformly thick layer of resist on the substrate. For example, even a 0.5° C. change in the substrate temperature can have a large effect on the thickness of the resist layer, and this effect may not be adequately addressed by directing rinsing solution toward the outer periphery of the substrate.

SUMMARY OF THE INVENTION

The present invention is directed toward methods and apparatuses for controlling the temperature of a microelectronic substrate. In one aspect of the invention, the apparatus can include a substrate support having at least one support surface for engaging and supporting the substrate. The apparatus can further include a temperature controller positioned at least proximate to the substrate support and having a first thermal link coupled directly with a first portion of the substrate and a second thermal link coupled directly with a second portion of the substrate. The first and second thermal links can be separately controllable for transferring heat to or from the first and second portions of the substrate at different rates.

In one aspect of the invention, the thermal link can include a plurality of nozzles proximate to the substrate, each nozzle having an orifice directed to a separate portion of the substrate. The nozzles can be arranged in an annular or concentric fashion to transfer heat to first and second annular regions of the substrate at different rates. The nozzles can direct streams of liquid or gas toward the substrate to either heat or cool selected regions of the substrate. In another aspect of this invention, the thermal links can include electrical elements positioned at least proximate to the substrate. The electrical elements can include resistive electrical heaters that heat the substrate or thermoelectric devices that can either heat or cool the substrate.

DETAILED DESCRIPTION OF THE INVENTION

The present invention is directed toward methods and apparatuses for controlling the temperature of a microelectronic substrate during manufacture. The apparatus can include a temperature controller that can vary the heat transferred to or from different portions of the substrate to keep the substrate temperature uniform, or to impose a temperature distribution on the substrate. Many specific details of certain embodiments of the invention are set forth in the following description and in FIGS. 1–4 to provide a thorough understanding of such embodiments. One skilled in the art, however, will understand that the present invention may have additional embodiments and that they may be practiced without several of the details described in the following description.

Figure 1:
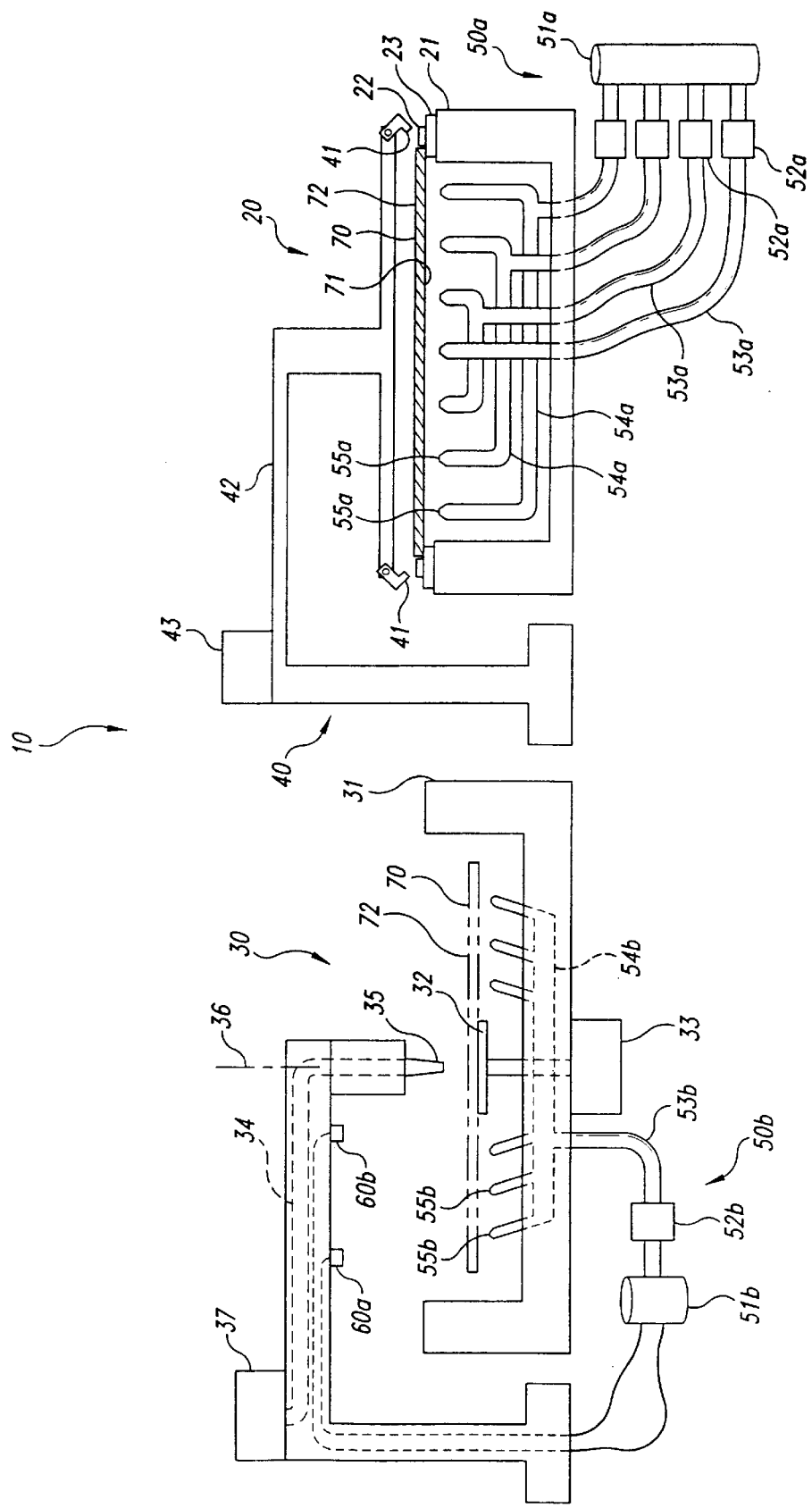
FIG. 1 is a partially schematic, partial cross-sectional side elevation view of an apparatus having a chill plate assembly and a coater bowl assembly in accordance with an embodiment of the invention.

FIG. 1 is a partially schematic, partial cross-sectional side elevation view of an apparatus 10 in accordance with an embodiment of the invention. The apparatus 10 can include a chill plate assembly 20 positioned proximate to a coater bowl assembly 30. A transfer device 40, such as a robotic arm, is positioned to transfer a microelectronic substrate 70 between the chill plate assembly 20 and the coater bowl assembly 30. Two temperature controllers 50 (shown as a plate temperature controller 50a and a bowl temperature controller 50b) can control the temperature of the substrate 70 when the substrate 70 is positioned on the chill plate assembly 20 and the coater bowl assembly 30, respectively.

In one embodiment, the chill plate assembly 20 can be configured to transfer heat to and/or from the substrate 70. For example, the chill plate assembly 20 can cool the substrate 70 after the substrate 70 receives a coating of primer in a high temperature process. Alternatively, the chill plate assembly 20 can be used to heat the substrate 70, or to heat one portion of the substrate 70 while cooling another portion. Accordingly, the plate temperature controller 50a can include a fluid supply 51a coupled with conduits 53a to manifolds 54a positioned proximate to the substrate 70. The manifolds 54a can include nozzles having orifices 55a facing the substrate 70. The fluid supply 51a can direct temperature-controlled fluid to the manifolds 54a and through the orifices 55a to form fluid streams or jets. The fluid streams or jets can impinge on a back side 71 of the substrate 70 to provide a plurality of thermal links between the plate temperature controller 50a and the substrate 70.

In one embodiment, the fluid supply 51a can include a source of liquid, such as water or other liquids that are compatible with the substrate 70. In another embodiment, the fluid supply 51a can include a source of gas, such as air, nitrogen, or other gases that are compatible with the substrate 70. In either case, the fluid supply 51a can be coupled to a plurality of heat exchangers 52a that are individually controllable to direct fluid at different temperatures to each manifold 54a. Accordingly, the plate temperature controller 50a can transfer heat to or from different portions of the substrate 70 at different rates.

In one aspect of this embodiment, the different heat transfer rates can generate a uniform temperature distribution over a front side 72 of the substrate 70 that initially had a non-uniform temperature distribution. For example, if the substrate 70 arrives at the chill plate assembly 20 with the periphery of the front side 72 cooler than the center of the front side 72, the plate temperature controller 50a can be operated to cool the center of the substrate 70 more rapidly than the periphery. Alternatively, the plate temperature controller 50a can generate a non-uniform temperature distribution on the front side 72 of the substrate 70 to compensate in advance for a subsequent non-uniform heat transfer process, as will be discussed in greater detail below.

In one embodiment, the substrate 70 can be positioned a selected distance above the orifices 55a. Accordingly, the chill plate assembly 20 can include a substrate support 21 having a plurality of stand-offs 23 that provide the desired separation between the substrate 70 and the orifices 55a. The stand-offs 23 can be spaced apart and arranged such that a substantial portion of the back side 71 of the substrate 70 is in contact with the thermal links provided by the temperature controller 50a. In a further aspect of this embodiment, each stand-off 23 can also include a centering guide 22 adjacent the outer edge of the substrate 70 for centering the substrate, as will be described in greater detail below with reference to FIG. 4.

In one embodiment, the manifolds 54a and orifices 55a can be arranged in an annular and/or concentric fashion with respect to each other, as shown in FIG. 1. Accordingly, the plate temperature controller 50a can be used to separately control the heat transferred to or from different annular regions of the substrate 70. In other embodiments, the manifold 54a and the orifices 55a can have other arrangements to control the heat transferred to or from regions of the substrate 70 having non-annular shapes. In still further embodiments, the orifices 55a can be positioned proximate to the front side 72 (rather than the back side 71) of the substrate 70 to transfer heat directly to or from the front side 72. An advantage of transferring heat to or from the back side 71 of the substrate 70 is that such a method may be less likely to damage components or features on the front side 72.

In one method of operation, the transfer device 40 moves the substrate 70 from a vapor deposition chamber (not shown) to the chill plate assembly 20 for cooling. The plate temperature controller 50a is then activated to cool the substrate 70. Once the substrate 70 has cooled, the transfer device 40 can retrieve the substrate 70 and move it to the coater bowl assembly 30, where the substrate 70 is shown in phantom lines. In one embodiment, the transfer device 40 can include an arm 42 having a plurality of fingers 41 that engage the back side 71 of the substrate 70 to lift the substrate 70 from the chill plate assembly 20. An actuator 43 coupled to the arm 42 and the fingers 41 can raise, lower and rotate the arm 42 with the substrate 70 attached and move the arm 42 and the substrate 70 to the coater bowl assembly 30.

The coater bowl assembly 30 can apply a liquid coating to the substrate 70 while rotating and controlling the temperature of the substrate 70. In one embodiment, the coater bowl assembly 30 includes a liquid source 37 coupled to a conduit 34. The conduit 34 terminates in a nozzle 35 that directs liquid from the liquid source 37 to the upward-facing front side 72 of the substrate 70. The substrate 70 is supported by a rotatable chuck 32, such as a vacuum chuck. The chuck 32 is coupled to a drive unit 33 for rotating the substrate 70 about a rotation axis 36. As the substrate 70 rotates, the liquid disposed on the front side 72 of the substrate 70 spreads over the front side 72 by centrifugal force. A coater bowl 31 is disposed annularly around the substrate 70 to collect liquid that runs off the edges of the substrate 70 as the substrate 70 rotates.

The bowl temperature controller 50b is coupled to the coater bowl assembly 30 to transfer heat to or away from the substrate 70 as the substrate 70 rotates relative to the coater bowl 31. In one embodiment, the temperature controller 50b includes a fluid supply 51b coupled to a single heat exchanger 52b which is in turn coupled with a conduit 53b to a single manifold 54b. The manifold 54b includes a plurality of orifices 55b disposed in a concentric, annular arrangement about the rotatable chuck 32 to transfer heat to or from the substrate 70.

The heat transferred to or from the substrate 70 can be controlled by adjusting the flow rate through each of the orifices 55b. For example, the orifices 55b toward the periphery of the substrate 70 can be smaller than those toward the center of the substrate 70 to reduce the rate of heat transfer to or from the periphery of the substrate 70. Alternatively, each of the orifices 55a can have a variable diameter that can be adjusted manually or via an actuator to direct the flow at a selected flow rate through each orifice 55a. In another embodiment, the bowl temperature controller 50b can include a plurality of heat exchangers 52b and manifolds 54b, arranged in a manner generally similar to that discussed above with reference to the plate temperature controller 50a.

In one embodiment, the coater bowl assembly 30 can also include one or more temperature sensors positioned proximate to the front side 72 of the substrate 70 to detect one or more temperatures of the substrate 70. For example, as shown in FIG. 1, the coater bowl assembly 30 can include a peripheral temperature sensor 60a aligned with the peripheral region of the substrate 70 and a central temperature sensor 60b aligned with the central region of the substrate. In one embodiment, the temperature sensors 60a, 60b can include infrared sensors and in other embodiments, the temperature sensors can include other suitable devices. The temperature sensors 60a, 60b can be coupled to the bowl temperature controller 50b to provide a temperature feedback loop. Accordingly, the bowl temperature controller 50b can receive signals from the temperature sensors 60a, 60b and adjust the heat transfer rate to and/or from the substrate 70 to achieve a desired temperature distribution on the front side 72 of the substrate 70.

In one embodiment, for example, where the fluid dispensed through the nozzle 35 is a resist material, it may be desirable to maintain the front side 72 of the substrate 70 at a uniform temperature, to prevent solvents in the resist material from evaporating more quickly in one region of the substrate 70 than another. For example, as the substrate 70 rotates about the rotation axis 36, the periphery of the substrate 70 will have a higher linear velocity than the center of the substrate 70, and may accordingly cool more quickly. Accordingly, in one aspect of the operation of the apparatus 10, the bowl temperature controller 50b can compensate for this effect by either heating the peripheral region of the substrate 70 or cooling the center region of the substrate 70. As a result, the front side 72 of the substrate 70 can be maintained at an approximately uniform temperature, reducing the likelihood that the resist solvent will evaporate unevenly, and therefore reducing the likelihood that the resist will locally thicken.

In an alternate method of operation, the periphery of the substrate 70 can be pre-heated (or the center region of the substrate 70 can be pre-cooled) at the chill plate assembly 20 before the substrate 70 is moved to the coater bowl assembly 30. The temperature distribution will then tend to become uniform as the substrate 70 rotates on the coater bowl assembly 30 and the periphery of the substrate 70 cools relative to the center of the substrate 70. The pre-heating and/or pre-cooling operation can be conducted in addition to or in lieu of controlling the temperature at the coater bowl assembly 30.

As was discussed above, the coater bowl assembly 30 can dispense a resist material on the surface of the substrate 70 in accordance with one embodiment of the invention. Alternatively, the coater bowl assembly 30 (or a similar, separate assembly) can be used to dispense other fluids, such as an antireflective coating or a developing solution. Where the coater bowl assembly 30 dispenses a resist material, the bowl temperature controller 50b can supply a resist solvent through the orifices 55b to prevent the resist from flowing around the periphery of the substrate 70 and collecting on the back side 71 of the substrate 70.

Figure 2:
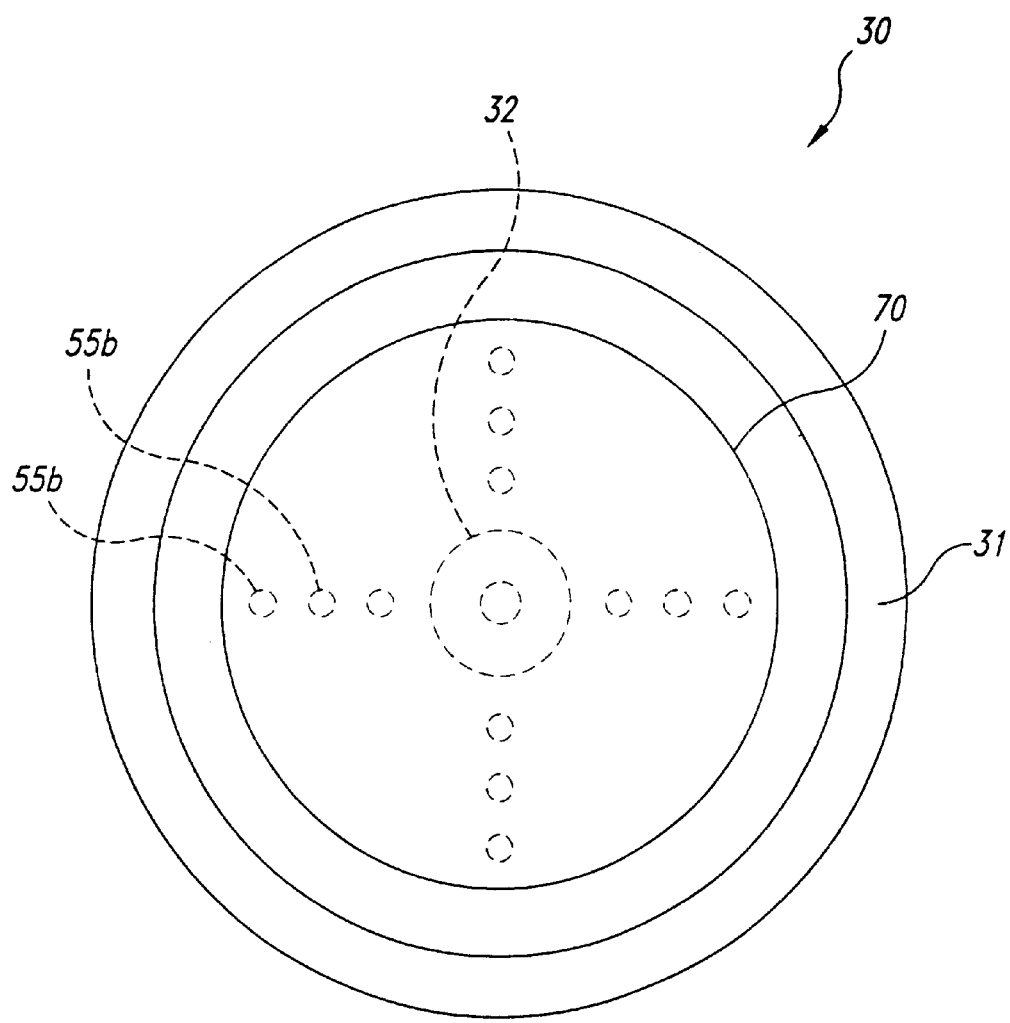
FIG. 2 is a top plan view of a portion of the coater bowl assembly shown in FIG. 1.

FIG. 2 is a top plan view of a portion of the coater bowl assembly 30 shown in FIG. 1. As shown in FIG. 2, the orifices 55b of the coater bowl assembly 30 can be arranged in three annular rings to transfer heat to or from three annular regions of the substrate 70. In one aspect of this embodiment, the orifices 55b are arranged in a cross-arm pattern to transfer heat at four evenly spaced locations within each annular region. In other embodiments, the coater bowl assembly 30 can include more or fewer orifices 55b within each annular region and/or more or fewer annular regions. The orifices 55a (FIG. 1) can be arranged similarly.

Figure 3:
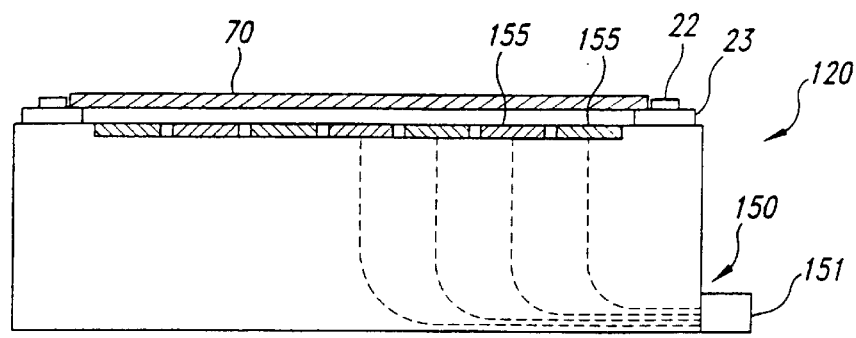
FIG. 3 is a partially schematic, partial cross-sectional side elevation view of a chill plate assembly in accordance with another embodiment of the invention.

FIG. 3 is a partially schematic, partial cross-sectional side elevation view of a portion of a chill plate assembly 120 in accordance with another embodiment of the invention. The chill plate assembly 120 can include a temperature controller 150 having a power supply 151 coupled to a plurality of electrical elements 155. In one embodiment, the electrical elements 155 can include resistive electrical heaters spaced apart from the substrate 70 to heat the substrate 70 directly by conduction, convection and/or radiation. Alternatively, the electrical elements 155 can include thermoelectric devices or some other device configured to heat or cool the substrate 70, depending upon the direction in which current is applied to the devices. Such thermoelectric devices are available from Melcor, Co., of Trenton, N.J. In one aspect of this embodiment, the substrate 70 can be spaced apart from the electrical elements 155 by a distance of approximately 0.13 mm and in other embodiments, the stand-off distance can be greater or lesser depending on the heat transfer characteristics of the substrate 70 and the electrical elements 155. For example, in one alternate embodiment, the stand-offs 23 can be eliminated and the substrate 70 can rest directly on the electrical elements 155. In some applications, it may be desirable to use the stand-offs 23 to avoid contaminating the back side 71 of the substrate 70.

Figure 4:
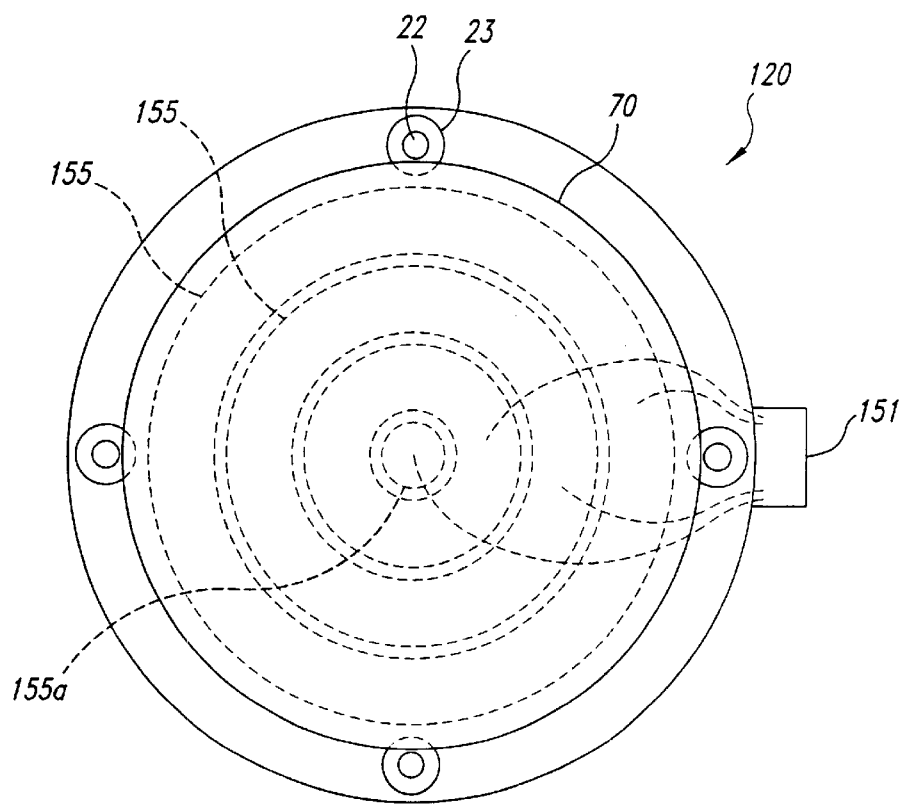
FIG. 4 is a top plan view of a portion of the chill plate assembly shown in FIG. 3.

FIG. 4 is a top plan view of the chill plate assembly 120 shown in FIG. 3. As shown in FIG. 4, the electrical elements 155 can be arranged annularly and concentrically in a manner similar to that discussed above with reference to the orifices 55a, 55b shown in FIG. 1. As is also shown in FIG. 4, the four centering guides 22 can be positioned around the periphery of the substrate 70 to center the substrate 70 over the innermost electrical element 155a. Accordingly, the centering guides 22 can be spaced apart from each other by a distance that is slightly greater than the diameter of the substrate 70.

An advantage of the electrical elements 155 discussed above with reference to FIGS. 3 and 4 is that they may more uniformly transfer heat to or from the substrate 70 than does a liquid or gas jet. Conversely, an advantage of the liquid and/or gas jets discussed above with reference to FIGS. 1 and 2 is that they may more quickly transfer heat to and/or from the substrate 70.

An advantage of the apparatus and methods discussed above with reference to FIGS. 1–4 is that they can more accurately control, adjust, and/or maintain the temperature of the substrate 70 before and/or during application of a fluid to the substrate 70. Accordingly, a fluid can be more uniformly distributed over the front side 72 of the substrate 70. As a result, subsequent processing operations can be more accurately controlled. For example, where the fluid dispensed on the front side 72 of the substrate 70 is a resist material, the more uniformly distributed resist material can be more uniformly exposed to a selected radiation, producing a more uniform etch pattern and therefore more accurately defined semiconductor devices.

From the foregoing it will be appreciated that, although specific embodiments of the invention have been described herein for purposes of illustration, various modifications may be made without deviating from the spirit and scope of the invention. For example, the chill plate assembly can be operated in conjunction with or independently from the coater bowl assembly. Accordingly, the invention is not limited except as by the appended claims.

What is claimed is:

1. A method for uniformly coating a microelectronic substrate having a first surface and a second surface opposite the first surface, the method comprising:

positioning the microelectronic substrate on a rotatable chuck;

prior to positioning the microelectronic substrate on the rotatable chuck, generating a temperature distribution over the first surface by directing a fluid directly against the second surface of the microelectronic substrate;

disposing a liquid on the first surface of the microelectronic substrate; rotating the microelectronic substrate about an axis generally perpendicular to the first surface; and controlling a temperature of the first surface of the microelectronic substrate by controlling a first rate of heat transferred directly to or from a first portion of the second surface of the microelectronic substrate and controlling a second rate of heat transferred directly to or from a second portion of the second surface while the microelectronic substrate rotates, the second rate being different than the first rate, wherein controlling a temperature includes directing a fluid through a nozzle directly against the substrate, and wherein directing a fluid includes directing a gas directly against the substrate.

2. The method of claim 1 wherein the first portion is spaced radially outwardly from the second portion and controlling a temperature includes transferring heat to the first portion of the microelectronic substrate at the first rate such that the first rate is higher than the second rate.

3. The method of claim 1 wherein directing a gas includes directing compressed air directly against the substrate.

4. The method of claim 1 wherein disposing a liquid includes disposing at least one of a resist material, an antireflective coating material and a developing solution.

5. The method of claim 1 wherein controlling a temperature of the substrate includes transferring heat at a first rate to or from a first portion of the substrate spaced apart from the rotation axis by a first distance and transferring heat at a second rate different than the first rate to or from a second portion of the substrate spaced apart from the rotation axis by a second distance different than the first distance.

6. The method of claim 1 wherein controlling a temperature includes heating the substrate.

7. The method of claim 1 wherein controlling a temperature includes cooling the substrate.

8. The method of claim 1, further comprising releasably attaching the substrate to a rotatable chuck.

9. The method of claim 1, further comprising collecting in an upwardly facing bowl excess fluid that drips from the substrate.

10. A method for controlling a temperature of a microelectronic substrate in connection with disposing a liquid on a first surface of the substrate, comprising:

positioning the microelectronic substrate on a support of a liquid dispensing apparatus;

prior to positioning the microelectronic substrate on the support, generating a temperature distribution over the first surface of the substrate by directing a fluid directly against a second surface of the microelectronic substrate, the second surface being opposite from the first surface;

controlling a first rate of heat transfer directly to or from a first portion of the second surface of the substrate, wherein controlling a first rate of heat transfer includes directing a gas through a nozzle to impinge directly against the second surface of the substrate;

controlling a second rate of heat transfer directly to or from a second portion of the second surface of the substrate, the second heat transfer rate being different than the first heat transfer rate; and disposing the liquid on the first surface of the substrate.

11. The method of claim 10, further comprising rotating the substrate to distribute the liquid over the first surface of the substrate.

12. The method of claim 10 wherein disposing a liquid includes disposing at least one of a resist material, an antireflective coating material and a developing solution.

13. The method of claim 10 wherein controlling the first rate of heat transfer includes heating the substrate.

14. The method of claim 10 wherein controlling the first rate of heat transfer includes cooling the substrate.

15. A method for controlling a temperature of a microelectronic substrate during application of a liquid to the substrate, the substrate having a first surface and a second surface opposite the first surface, the method comprising:

positioning the substrate on a support of a liquid application apparatus;

prior to positioning the substrate on the support, generating a temperature distribution over the first surface of the substrate by directing a fluid directly against the second surface of the microelectronic substrate;

disposing the liquid on the first surface of the substrate;

rotating the substrate to distribute the liquid over the first surface of the substrate; and directing a gas flow directly against the second surface of the substrate to control a temperature of the first surface of the substrate, wherein directing a gas flow includes directing a first gas flow toward a first portion of the substrate to transfer heat to or from the first portion at a first rate and directing a second gas flow toward the second portion of the substrate to transfer heat to or from the second portion at a second rate different than the first rate.

16. The method of claim 15 wherein directing a gas flow includes directing a flow of compressed air.

17. The method of claim 15 wherein disposing the liquid includes disposing a liquid resist material on the substrate.

* * * * *